United States Patent
Kim et al.

(10) Patent No.: US 9,966,317 B2
(45) Date of Patent: May 8, 2018

(54) SEMICONDUCTOR DEVICE AND SEMICONDUCTOR PACKAGE COMPRISING THE SAME

(71) Applicants: Joung-Yeal Kim, Yongin-si (KR); Dae-Hyun Kwon, Hwaseong-si (KR); Mi-Young Woo, Seongnam-si (KR); Joon-Sun Yoon, Hwaseong-si (KR); Jong-Hyun Choi, Suwon-si (KR)

(72) Inventors: Joung-Yeal Kim, Yongin-si (KR); Dae-Hyun Kwon, Hwaseong-si (KR); Mi-Young Woo, Seongnam-si (KR); Joon-Sun Yoon, Hwaseong-si (KR); Jong-Hyun Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/298,919

(22) Filed: Oct. 20, 2016

(65) Prior Publication Data
US 2017/0117198 A1    Apr. 27, 2017

(30) Foreign Application Priority Data
Oct. 21, 2015    (KR) .......................... 10-2015-0146546

(51) Int. Cl.
*H01L 21/66* (2006.01)
*H01L 23/498* (2006.01)
(Continued)

(52) U.S. Cl.
CPC ........ *H01L 22/32* (2013.01); *H01L 23/49811* (2013.01); *H01L 23/49838* (2013.01); *H01L 27/0802* (2013.01); *H01L 28/20* (2013.01)

(58) Field of Classification Search
CPC ......... H01L 22/14; H01L 22/34; H01L 22/32; H01L 23/49811; H01L 23/49838;
(Continued)

(56) References Cited

U.S. PATENT DOCUMENTS 5,854,534 A * 12/1998 Beilin ................... H01L 21/486
257/691
6,137,161 A    10/2000 Gilliland et al.
(Continued)

FOREIGN PATENT DOCUMENTS

KR         1531097        3/2015
KR    2015-0081607 A     7/2015

*Primary Examiner* — Cheung Lee
*Assistant Examiner* — Stephen C Smith
(74) *Attorney, Agent, or Firm* — Harness, Dickey & Pierce, P.L.C.

(57) ABSTRACT

A semiconductor device may include a first terminal electrically connected to a first semiconductor chip, a second terminal electrically connected to a second semiconductor chip, which is different from the first semiconductor chip, a first signal line electrically connecting the first terminal and the second terminal and including a first node, a third terminal connected to a tester monitoring a signal transmitted between the first semiconductor chip and the second semiconductor chip, a fourth terminal applied a reference voltage, a second signal line electrically connecting the third terminal and the fourth terminal and including a second node, a first resistor connected between the first node and the second node and a second resistor directly connected to the second node different from the first resistor.

20 Claims, 16 Drawing Sheets

(51) Int. Cl.
*H01L 49/02* (2006.01)
*H01L 27/08* (2006.01)

(58) Field of Classification Search
CPC ... H01L 28/20; H01L 27/0802; G01R 31/282; G01R 31/2884; G01R 19/02; G01R 27/02
See application file for complete search history.

(56) References Cited

U.S. PATENT DOCUMENTS

| | | | |
|---|---|---|---|
| 6,147,876 A * | 11/2000 | Yamaguchi | H01L 23/24 257/698 |
| 6,242,932 B1 | 6/2001 | Hembree | |
| 6,477,034 B1 | 11/2002 | Chakravorty et al. | |
| 6,529,027 B1 | 3/2003 | Akram et al. | |
| 6,661,088 B1 | 12/2003 | Yoda et al. | |
| 6,671,947 B2 | 1/2004 | Bohr | |
| 6,833,285 B1 | 12/2004 | Ahn et al. | |
| 6,965,244 B2 * | 11/2005 | Miller | G01R 1/07314 324/754.14 |
| 7,233,061 B1 | 6/2007 | Conn | |
| 8,098,076 B2 * | 1/2012 | Chen | G01R 31/31905 324/754.07 |
| 8,599,596 B2 * | 12/2013 | Riho | G11C 5/02 257/686 |
| 2010/0253374 A1 * | 10/2010 | Chen | G01R 31/31905 324/756.03 |
| 2012/0286814 A1 * | 11/2012 | Wang | G01R 1/07378 324/754.03 |
| 2015/0055312 A1 | 2/2015 | Lee et al. | |
| 2015/0087089 A1 * | 3/2015 | Wang | G01R 1/07378 438/15 |
| 2016/0065334 A1 * | 3/2016 | Warwick | H04L 41/24 370/249 |

* cited by examiner

SEMICONDUCTOR DEVICE AND SEMICONDUCTOR PACKAGE COMPRISING THE SAME

This application claims priority to Korean Patent Application No. 10-2015-0146546 filed on Oct. 21, 2015 in the Korean Intellectual Property Office, the disclosure of which is incorporated herein by reference in its entirety.

BACKGROUND

1. Technical Field

Example embodiments of the inventive concepts relate to a semiconductor device and/or a semiconductor package including the same.

2. Description of the Related Art

Semiconductor devices have increasingly become compact but highly functional. Also, as the operating speed of semiconductor devices has increased, the signal integrity characteristics of semiconductor devices in a high-speed operating state has become of greater importance.

Thus, for a performance evaluation for testing the signal integrity characteristics of semiconductor devices, it may be desirable to reduce the influence of signal distortion.

Various schemes have been employed to reduce the influence of signal distortion and thus improve the signal integrity of semiconductor devices especially in a high-speed operating state.

SUMMARY

Example embodiments of the inventive concepts provide a semiconductor device for improving the signal integrity in a high-speed operating condition and/or a semiconductor package including the semiconductor device.

Example embodiments of the inventive concepts also provide a semiconductor device for reducing the influence of signal distortion on the measurement of signals and/or a semiconductor package including the semiconductor device.

However, example embodiments of the inventive concepts are not restricted to those set forth herein. The above and other example embodiments of the inventive concepts will become more apparent to one of ordinary skill in the art to which the inventive concepts pertain by referencing the detailed description of some example embodiments of the inventive concepts given below.

Some example embodiments of the inventive concepts relate to semiconductor device.

In some example embodiments, the semiconductor device includes a first terminal electrically connected to a first semiconductor chip; a second terminal electrically connected to a second semiconductor chip; a first signal line configured to electrically connect the first terminal and the second terminal; a third terminal configured to electrically connect to a tester, the tester configured to monitor a signal transmitted between the first semiconductor chip and the second semiconductor chip; a second signal line configured to electrically connect the third terminal and a fourth terminal, the fourth terminal configured to receive a reference voltage; a first resistor electrically connected between a first node associated with the first signal line and a second node associated with the second signal line; and a second resistor electrically connected between the second node and the fourth terminal.

In some example embodiments, the semiconductor device further includes an interposer configured to electrically connect the tester to the semiconductor device.

In some example embodiments, the reference voltage is a power supply voltage.

In some example embodiments, a sum of a resistance of resistor components of the tester and a resistance of the second resistor equals a resistance of the first resistor.

In some example embodiments, the second resistor and the first resistor are connected in parallel to the second node.

Some example embodiments relate to a semiconductor package.

In some example embodiments, the semiconductor package includes a circuit board including a reference voltage terminal configured to receive a reference voltage; an interposer electrically connected to the circuit board, the interposer including a tester terminal; and a first semiconductor chip on the interposer, the first semiconductor chip configured to electrically connect to the circuit board and the interposer, the interposer including, a first wire configured to electrically connect the circuit board and the first semiconductor chip, a second wire configured to electrically connect to the first wire includes a first resistor, and a third wire configured to electrically connect the tester terminal and the reference voltage terminal, the third wire including a second resistor.

In some example embodiments, the reference voltage is a power supply voltage.

In some example embodiments, the second wire includes a first region and a second region each having a different electrical conductivity, the second region having the first resistor associated therewith, and the third wire includes a third region and a fourth region each having a different electrical conductivity, the fourth region having the second resistor associated therewith.

In some example embodiments, the electrical conductivity of the second region differs from the electrical conductivity of the fourth region.

In some example embodiments, the electrical conductivity of the first region is higher than the electrical conductivity of the second region, and the electrical conductivity of the third region is higher than the electrical conductivity of the fourth region.

In some example embodiments, the second wire is electrically connected to the third wire.

In some example embodiments, the semiconductor package further includes a second semiconductor chip electrically connected to the circuit board and electrically isolated from the interposer, the second semiconductor chip electrically connected to the first wire.

In some example embodiments, the tester terminal is configured to connect to a tester, the tester being configured to monitor a signal transmitted between the first semiconductor chip and the second semiconductor chip.

In some example embodiments, the first wire electrically connects a first terminal associated with the first semiconductor chip and a second terminal associated with the circuit board, the first semiconductor chip is electrically connected to the interposer via the first terminal, and the circuit board is electrically connected to the interposer via the second terminal.

In some example embodiments, a sum of a resistance of resistor components of the tester and a resistance of the second resistor equals a resistance of the first resistor Some example embodiments relate to a semiconductor device.

In some example embodiments, the semiconductor device includes an interposer configured to electrically connect a testing device to a first signal path between a first semiconductor chip and a second semiconductor chip, the testing device configured to monitor a signal transmitted via the first signal path between the first semiconductor chip and the second semiconductor chip, the interposer including, a first resistor configured to electrically connect a first node and a second node, the first node being a node on the first signal path between the first semiconductor chip and the second semiconductor chip and the second node being a node on a second signal path between the first node and the testing device, and a second resistor configured to electrical connect a reference terminal and the second node, the reference terminal configured to receive a reference voltage.

In some example embodiments, the first signal path includes a first line configured to electrically connect the first semiconductor chip and the second semiconductor chip and the second signal path includes a second line and a third line, the second line configured to electrically connect the first node and the second node, and the third line configured to electrically connect the testing device to the second node.

In some example embodiments, the first line is configured to electrically connect the first semiconductor chip and a circuit board having the second semiconductor chip thereon such that the second semiconductor chip is electrically connected to the interposer via the circuit board, In some example embodiments, the first resistor has a resistance equal to a sum of a resistance of the testing device and a resistance of the second resistor.

In some example embodiments, the first resistor is configured to reduce distortion in the signal transmitted between the first semiconductor chip and the second semiconductor chip, and the second resistor is configured to compensate for an effect of termination of the testing device.

Other features and example embodiments will be apparent from the following detailed description, the drawings, and the claims.

BRIEF DESCRIPTION OF THE DRAWINGS

The above and other aspects and features of the example embodiments of the inventive concepts will become more apparent by describing in detail example embodiments thereof with reference to the attached drawings, in which.

DETAILED DESCRIPTION

Figure 1:
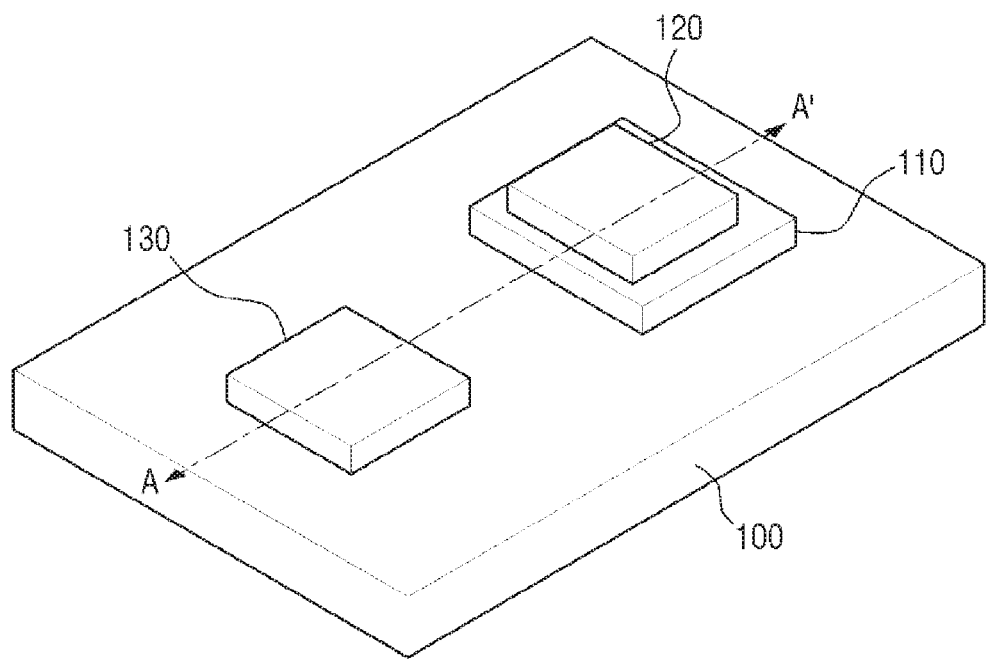
FIG. 1 is a perspective view of a semiconductor package including a semiconductor device according to example embodiments of the inventive concepts.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

It should be understood, however, that there is no intent to limit this disclosure to the particular example embodiments disclosed. On the contrary, example embodiments are to cover all modifications, equivalents, and alternatives falling within the scope of the example embodiments. Like numbers refer to like elements throughout the description of the figures.

In addition, terms such as first, second, A, B, (a), (b), and the like may be used herein to describe components. Each of these terminologies is not used to define an essence, order or sequence of a corresponding component but used merely to distinguish the corresponding component from other component(s). It should be noted that if it is described in the specification that one component is "connected", "coupled", or "joined" to another component, a third component may be "connected", "coupled", and "joined" between the first and second components, although the first component may be directly connected, coupled or joined to the second component.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), System-on-Chip (SoC), a programmable logic unit, a microprocessor, or any other device capable of responding to and executing instructions in a defined manner.

For example, when a hardware device is a computer processing device (e,g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Various example embodiments will now be described more fully with reference to the accompanying drawings in which some example embodiments are shown. In the drawings, the thicknesses of layers and regions are exaggerated for clarity.

A semiconductor device and/or a semiconductor package including the same, according to example embodiments of the inventive concepts, will hereinafter be described with reference to FIGS. 1 through 3.

FIG. 1 is a perspective view of a semiconductor package including a semiconductor device according to example embodiments of the inventive concepts. FIG. 2 is a cross-sectional view taken along line A-A' of FIG. 1. FIG. 3 is an enlarged view of an area I of FIG.

Figure 2:
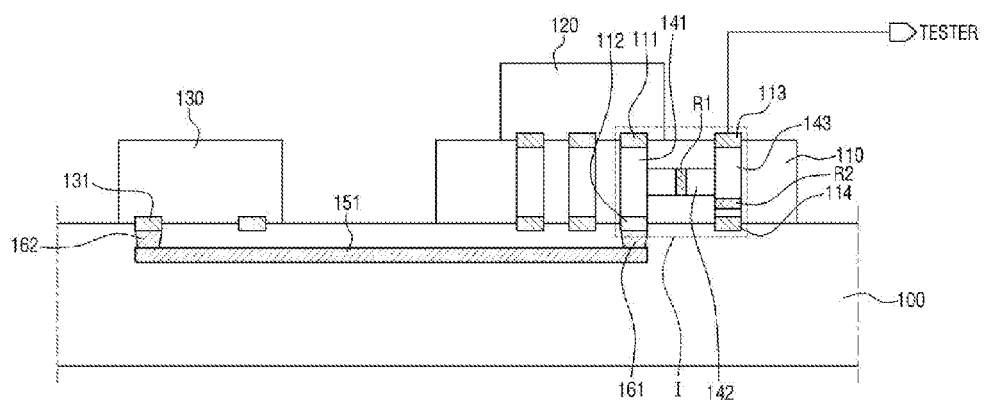
FIG. 2 is a cross-sectional view taken along line A-A' of FIG. 1.
Figure 3:
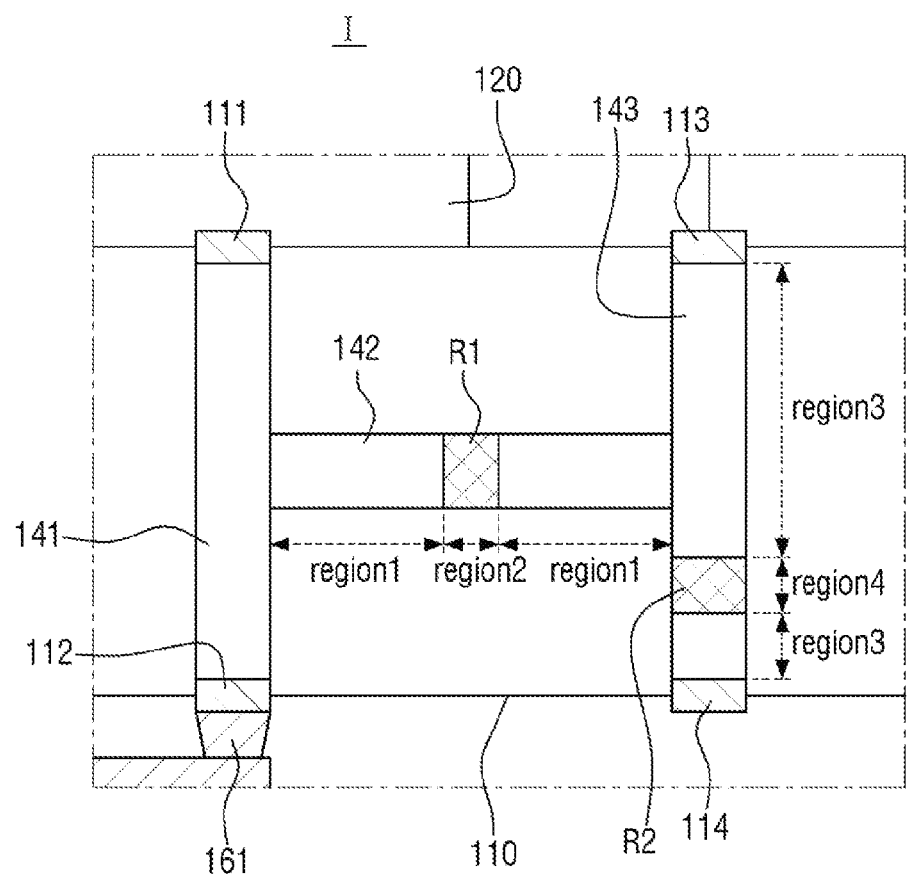
FIG. 3 is an enlarged view of an area I of FIG. 2.

Referring to FIGS. 1 through 3, a semiconductor device and a semiconductor package including the same, according to example embodiments of the inventive concepts, may include a circuit board 100, a first semiconductor chip 120, a second semiconductor chip 130, and an interposer 110.

In some example embodiments, the circuit board 100 may be a printed circuit board (PCB).

The circuit board 100 may include a reference voltage terminal. The reference voltage terminal may be a fourth terminal 114, which will be described later, but example embodiments of the inventive concepts are not limited thereto. For example, the reference voltage terminal may be provided at a different location from the fourth terminal 114, in which case, the fourth terminal 114 may be electrically connected to the reference voltage terminal of the circuit board 100 via wiring.

In some example embodiments, a reference voltage may include, for example, a power supply voltage, in which case, no particular power supply voltage for driving the interposer 110 may be needed. However, example embodiments are not limited thereto. That is, alternatively, the reference voltage may include, for example, a ground voltage.

FIGS. 1 through 3 illustrate that the circuit board 100 is provided, but the disclosure is not limited thereto. That is, in response to the semiconductor package being a package-on-package (POP) product, the circuit board 100 may not be provided.

The first semiconductor chip 120 may be electrically connected to the circuit board 100 and the interposer 110. More specifically, the first semiconductor chip 120 may be electrically connected to the interposer 110 via a first terminal 111.

The first semiconductor chip 120 may be disposed on, for example, the interposer 110, but the disclosure is not limited thereto. That is, alternatively, the first semiconductor chip 120 may be disposed on a side of the interposer 110, in which case, the first semiconductor chip 120 may be electrically connected to the interposer 110 via wiring.

Various types of memory devices may be used as the first semiconductor chip 120. The first semiconductor chip 120 may be, for example, a volatile semiconductor memory device or a nonvolatile semiconductor memory device. The volatile semiconductor memory device may be, for example, a dynamic random access memory (DRAM) or a static random access memory (SRAM). The nonvolatile semiconductor memory device may be, for example, an erasable programmable read-only memory (EPROM), an electrically EPROM (EEPROM), or a flash EEPROM.

The interposer 110 may be disposed on the circuit board 100 and may be electrically connected to the circuit board 100. More specifically, the interposer 110 may be electrically connected to the circuit board 100 via a second terminal 112.

The interposer 110 may include the first terminal 111, the second terminal 112, a third terminal 113, and the fourth terminal 114.

The first terminal 111 may electrically connect the interposer 110 and the first semiconductor chip 120. The second terminal 112 may electrically connect the interposer 110 and the circuit board 100.

The third terminal 113 may be a tester terminal. That is, a tester TESTER monitoring a signal transmitted between the first semiconductor chip 120 and a second semiconductor chip 130, which will be described later, may be connected to the third terminal 113. The reference voltage may be applied to the fourth terminal 114.

The first through fourth terminals 111 through 114 may be provided as solder balls, but the disclosure is not limited thereto. For example, the first through fourth terminals 111 through 114 may be provided as conductive bumps, conductive spacers, or pin grid arrays (PGAs).

In some example embodiments, in response to the first through fourth terminals 111 through 114 being provided as solder balls, the circuit board 100 and the first semiconductor chip 120 may be directly electrically connected to each other via the solder balls without the aid of additional circuit wiring. Thus, the distance by which an electric signal is to be transmitted may be maintained at or near its minimum. Also, the electrical properties of the semiconductor device may be improved.

The interposer 110 may include a first wire 141, a second wire 142, a third wire 143, a first resistor R1, and a second resistor R2.

The first wire 141 may electrically connect the first terminal 111 and the second terminal 112. In other words, the first wire 141 may electrically connect the circuit board 100 and the first semiconductor chip 120.

The first wire 141 may be a path of the transmission of a signal between the first semiconductor chip 120 and the circuit board 100. That is, the first wire 141 may be a path of the transmission of a signal between the first semiconductor chip 120 and the second semiconductor chip 130, and this will be described later in detail.

The second wire 142 may electrically connect the first wire 141 and the third wire 143. The second wire 142 may include the first resistor R1.

The second wire 142 may include a first region "region1," and a second region "region2" including the first resistor R1. In some example embodiments, the first region "region1" may be provided on both sides of the second region "region2".

The electrical conductivity of the first region "region1" of the second wire 142 may differ from the electrical conductivity of the second region "region2" of the second wire 142. For example, the electrical conductivity of the first region "region1" may he higher than the electrical conductivity of the second region "region2".

The third wire 143 may electrically connect the third terminal 113 and the fourth terminal 114. In some example embodiments, the third wire 143 may electrically connect the tester terminal and the reference voltage terminal. That is, the third terminal 113 may be a tester terminal, and the fourth terminal 114 may be a terminal for applying the reference voltage.

The third wire 143 may allow the tester TESTER, which is connected to the third terminal 113, to monitor a signal transmitted between the first semiconductor chip 120 and the second semiconductor chip 130 via the first wire 141.

The third wire 143 may include the second resistor R2, which is a different resistor from the first resistor R1. The third wire 143 may include a third region "region3" and a fourth region "region4", where the fourth region may include the second resistor R2.

In some example embodiments, the third region "region3" may be provided on both sides of the fourth region "region4".

The electrical conductivity of the third region "region3" of the third wire 143 may differ from the electrical conductivity of the fourth region "region4" of the third wire 143. For example, the electrical conductivity of the third region "region3" may be higher than the electrical conductivity of the fourth region "region4".

The electrical conductivity of the second region "region2" of the second wire 142 may differ from the electrical conductivity of the fourth region "region4" of the third wire 143. The electrical conductivity of each region may vary depending on, for example, the resistance of resistor components included in the tester TESTER, which is electrically connected to the third terminal 113.

The resistance of the first resistor R1 may be the same as the sum of the resistance of the resistor components included in the tester TESTER, which is electrically connected to the third terminal 113, and the resistance of the second resistor R2.

In some example embodiments, the second resistor R2 may be provided between the fourth terminal 114 and a node at which the second wire 142 and the third wire 143 are electrically connected to each other.

The second semiconductor chip 130 may be isolated from the interposer 110 over the circuit board 100. The second semiconductor chip 130 may be electrically connected to the circuit board 100 via the first terminal 131 of the second semiconductor chip 130.

The second semiconductor chip 130 may be electrically connected to the second terminal 112. That is, the second semiconductor chip 130 may be electrically connected to the interposer 110 via the second terminal 112.

More specifically, the circuit board 100 may include a first via 161, a second via 102, and a first transmission line 151. The first via 161 may connect the second terminal 112 and the first transmission line 151. The second via 162 may connect the first terminal 131 of the second semiconductor chip 130 and the first transmission line 151.

Thus, the second semiconductor chip 130 may be electrically connected to the second terminal 112 via the first transmission line 151.

Also, since the second terminal 112 is electrically connected to the first semiconductor chip 120 via the first wire 141, the second semiconductor chip 130 may be electrically connected to the first semiconductor chip 120.

In some example embodiments, in response to the semiconductor package being a POP product, the interposer 110 and the second semiconductor chip 130 may be directly electrically connected to each other without the aid of the circuit board 100, The second semiconductor chip 130 may be of a different type from the first semiconductor chip 120 or of the same type as the first semiconductor chip 120.

The semiconductor package may include the interposer 110, which includes the third terminal 113. As mentioned above, the third terminal 113 may be a tester terminal for the tester TESTER monitoring a signal transmitted between the first semiconductor chip 120 and the second semiconductor chip 130. That is, the tester TESTER may be connected to the third terminal 113.

The tester TESTER, may he a test instrument not included in the semiconductor package. In other words, the third terminal 113 may be connected to the outside of the semiconductor package.

The tester TESTER may be, for example, an instrument capable of testing a signal transmitted between semiconductor chips, such as an oscilloscope, a digital multimeter or a logic analyzer.

The semiconductor device and the semiconductor package according to example embodiments of the inventive concepts will hereinafter be described in further detail with reference to FIGS. 2 through 5, avoiding any redundant description for clarity.

Figure 4:
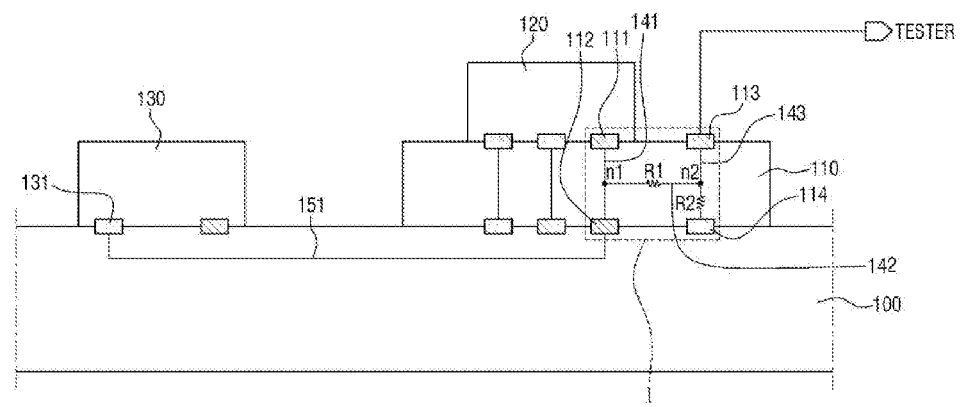
FIG. 4 is a circuit diagram of FIG. 2.
Figure 5:
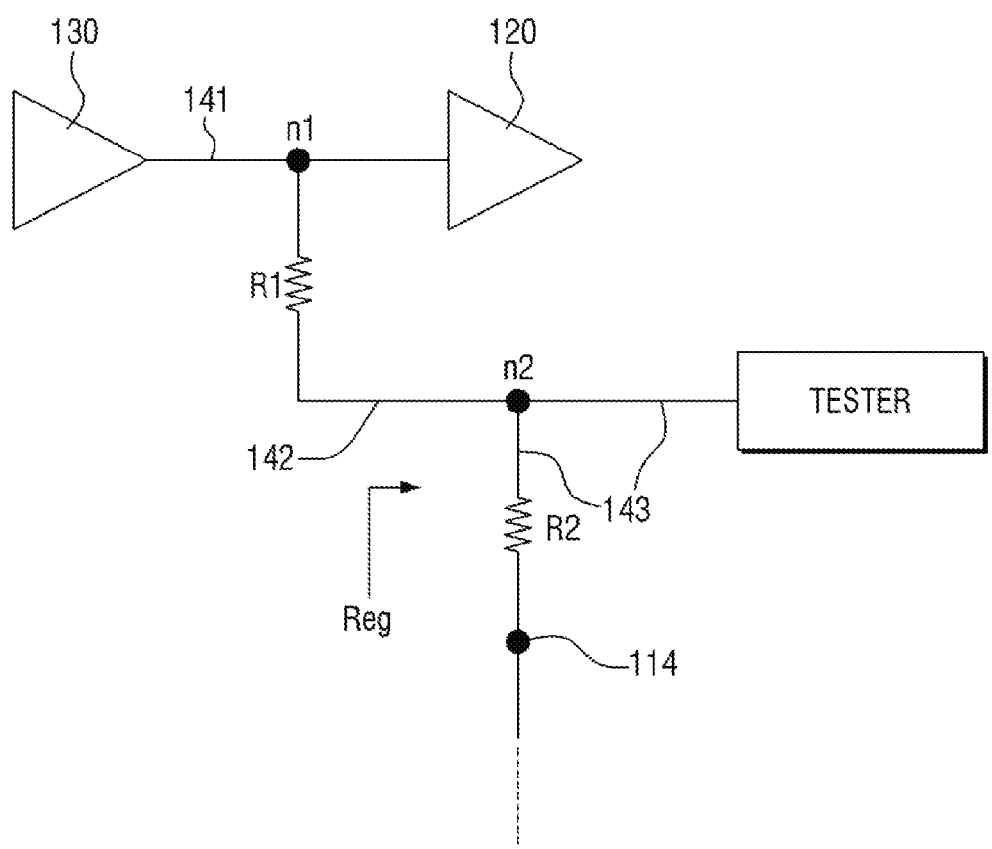
FIG. 5 is a block diagram of FIG. 4.

FIG. 4 is a circuit diagram of FIG. 2. FIG. 5 is a block diagram of FIG. 4.

Referring to FIGS. 2 through 5, the semiconductor device and the semiconductor package may include the interposer 110 to electrically connect the tester TESTER.

The interposer 110 may include the first wire 141 acting as a first signal line 141, the third wire 143 acting as a second signal line 143, a first node n1, a second node n2, the first resistor R1, and the second resistor R2.

The first signal line 141 may be the first wire 141 of FIG. 2. That is, the first signal line 141 may electrically connect the first terminal 111 and the second terminal 112. The first signal line 141 may include the first node n1.

The second signal line 143 may be the third wire 143 of FIG, 2. That is, the second signal line 143 may electrically connect the third terminal 113 and the fourth terminal 114. The second signal e 143 may include the second node n2.

The second signal line 143 may electrically connect the first signal line 141 and the tester TESTER. That is, the second signal line 143 may be connected to the tester TESTER.

The first node n1 may be a point at which the first wire 141 and the second wire 142 are electrically connected to each other. The second node n2 may be a point at which the second wire 142 and the third wire 143 are electrically connected to each other.

The first resistor R1 may be connected between the first node and the second node n2. For example, one end of the first resistor R1 may be connected to the first node 1,L and the other end of the first resistor R1 may be connected to the second resistor R2.

The second resistor R2 may be directly connected to the second node n2. The second resistor R2 may be connected between the second node n2 and the fourth terminal 114. That is, one end of the second resistor R2 may be directly connected to the second node n2, and the other end of the second resistor R2 may be connected to the fourth terminal 114 to which the reference voltage is applied.

In some example embodiments, one end of the second resistor R2 may be directly connected to the second node n2, and the other end of the second resistor R2 may be connected to a power supply voltage via the fourth terminal 114. Alternatively, one end of the second resistor R2 may be directly connected to the second node n2, and the other end of the second resistor R2 may be connected to a ground voltage via the fourth terminal 114.

The resistance of the first resistor R1 may differ from the resistance of the second resistor R2, but the disclosure is not limited thereto. The resistance of the second resistor R2 may be adjusted according to the resistance of the resistor components included in the tester TESTER, which is electrically connected to the third terminal 113.

A path of the transmission of a signal between the first semiconductor chip 120 and the second semiconductor chip 130 may include the first signal line 141. That is, a signal may be transmitted between the first semiconductor chip 120 and the second semiconductor chip 130 via the first signal line 141.

The first resistor R1, which is connected between the first node n1 and the second node n2, and the second signal line 143, which is connected between the second node n2 and the tester TESTER, may form another signal path. That is, the tester TESTER may be connected to the first signal line 141 via the first node n1 and the second node n2, The first resistor R1 may be disposed as near as possible to the first signal line 141. The second resistor R2 may be disposed at a desired (or, alternatively, an arbitrary) location between the first resistor R1 and the tester TESTER.

The second resistor R2 may be connected in parallel to the first resistor R1 relative to the second node n2. In other words, when viewed from the tester TESTER, the first resistor R1 and the second resistor R2 may be connected in parallel to each other.

The resistance of a total or equivalent resistor Req may be the sum of the resistances of resistor components when the tester TESTER is viewed from the first resistor R1. For example, the resistance of the total resistor Req may be the sum of the resistance of the second resistor R2 and the resistances of the resistor component of the tester TESTER.

In some example embodiments, the resistance of the first resistor R1 may be the same as the resistance of the total resistor Req.

The semiconductor device and the semiconductor package according to example embodiments of the inventive concepts will hereinafter be described in further detail with reference to FIGS. 1 and 4 through 7, avoiding any redundant description for clarity.

Figure 6:
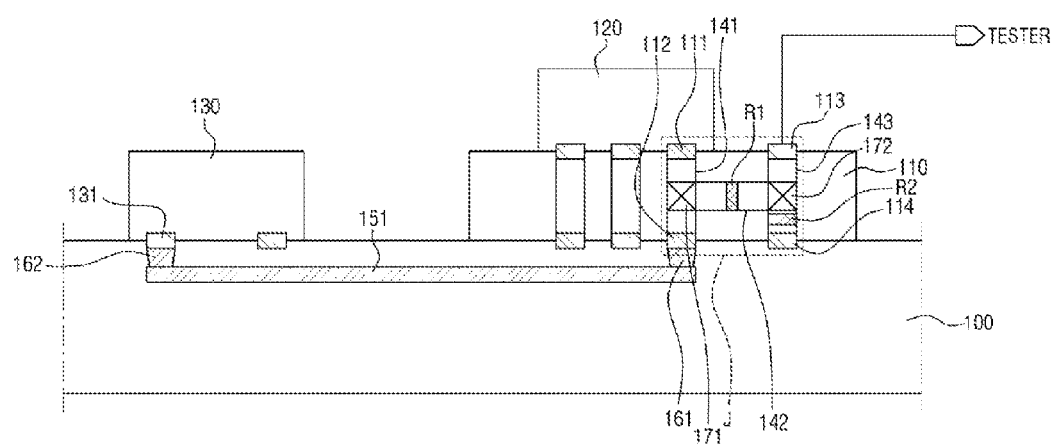
FIG. 6 is a cross-sectional view taken along line A-A' of FIG. 1.
Figure 7:
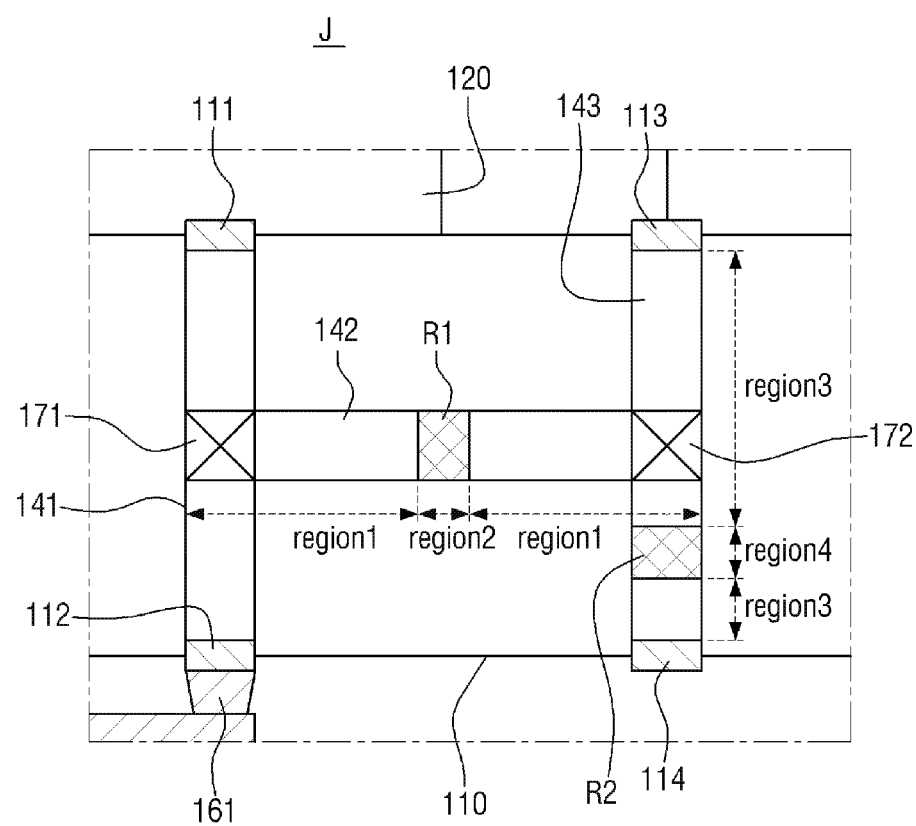
FIG. 7 is an enlarged view of an area J of FIG. 6.

FIG. 6 is a cross-sectional view taken along line A-A' of FIG. 1. FIG. 7 is an enlarged view of an area J of FIG. 6.

Referring to FIGS. 1 and 4 through 7, the interposer 110 may further include a first contact 171 and a second contact 172.

The first wire 141 and the second wire 142 may be electrically connected by the first contact 171. The second wire 142 and the third wire 143 may be electrically connected by the second contact 172, For example, the first wire 141, the second wire 142, and the third wire 143 may not he disposed on the same plane as one another. That is, the second wire 142 may be connected to the first wire 141 and the third wire 143 via the first contact 171 and the second contact 172, instead of being directly connected to the first wire 141 and the third wire 143. The second wire may overlap the first wire 141 and the third wire 143.

The first resistor R1 may be disposed between, for example, the first contact 171 and the second contact 172. The second resistor R2 may be disposed between, for example, the second contact 172 and the fourth terminal 114. The third region "region3" of the third wire 143 may include the second contact 172.

A circuit configuration illustrated in FIGS. 6 and 7 may be identical to that illustrated in FIGS. 4 and 5.

The semiconductor device and the semiconductor package according to example embodiments of the inventive concepts will hereinafter be described in further detail with reference to FIGS. 1 and 4 through 9, avoiding any redundant description for clarity.

Figure 8:
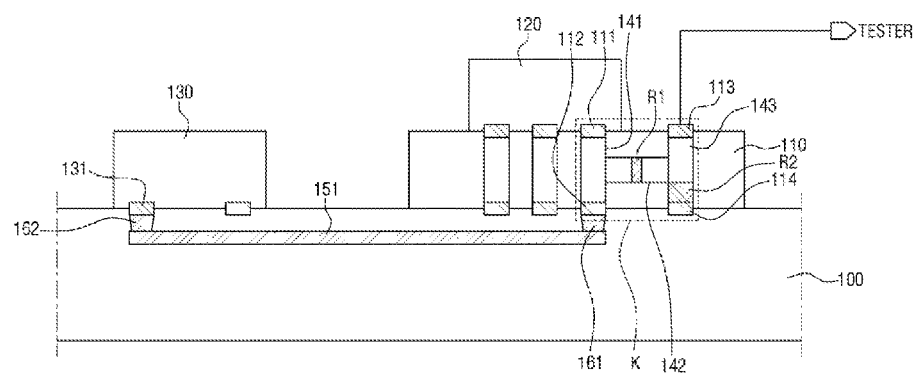
FIG. 8 is a cross-sectional view taken along line A-A' of FIG. 1.
Figure 9:
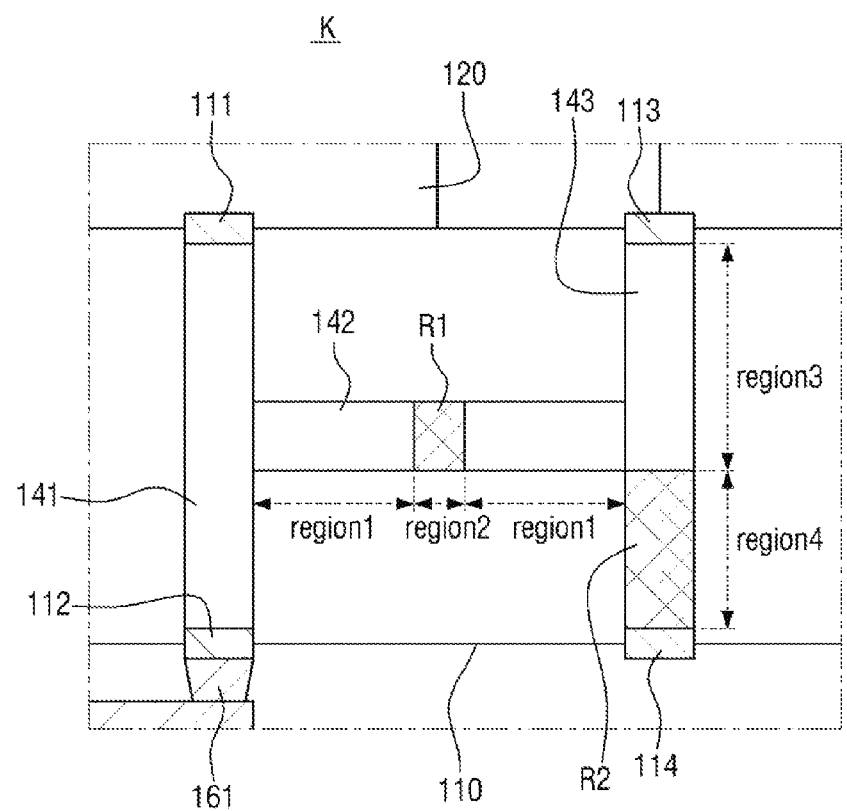
FIG. 9 is an enlarged view of an area K of FIG. 8.

FIG. 8 is a cross-sectional view taken along line A-A' of FIG. 1. FIG. 9 is an enlarged view of an area K of FIG. 8.

Referring to FIGS. 1, 4, 5, 8, and 9, in some example embodiments, the third region "region3" of the third wire 143 may not necessarily be provided on both sides of the fourth region "region4".

That is, the fourth region "region4" may account for the entire area between the second node n2 at which the second wire 142 and the third wire 143 are electrically connected and the fourth terminal 114.

The fourth region "region4" where the second resistor R2 is formed may include a material having a different electrical conductivity from that of the third region "region3" of the third wire 143. In other words, a material having a different electrical conductivity from that of the third region "region3" of the third wire 143 may be formed in the area ranging from the node at which the second wire 142 and the third wire 143 are electrically connected to the fourth terminal 114.

In some example embodiments, the second wire 142 may be connected to the first wire 141 and the third wire 143 via contacts. That is, the first wire 141, the second wire 142, and the third wire 143 may not necessarily be disposed on the same plane as one another.

In response to the second wire 142 being connected to the first wire 141 and the third wire 143 via contacts, the second resistor R2 may be formed between the contact electrically connecting the second wire 142 and the third wire 143 and the fourth terminal 114.

A circuit configuration illustrated in FIGS. 8 and 9 may be identical to that illustrated in FIGS. 4 and 5.

The semiconductor device and the semiconductor package according to example embodiments of the inventive concepts will hereinafter be described in further detail with reference to FIGS. 1, 10, and 11, avoiding any redundant description for clarity.

Figure 10:
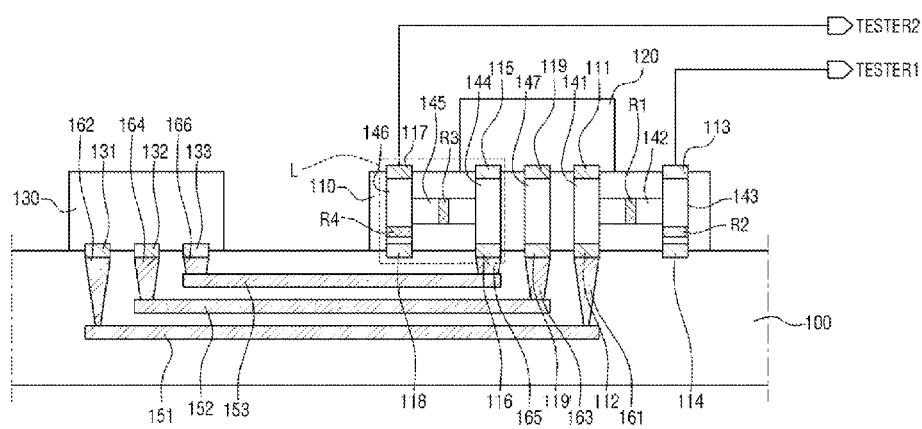
FIG. 10 is a cross-sectional view taken along line A-A' of FIG. 1.

FIG. 10 is a cross-sectional view taken along line A-A' of FIG. 1. FIG. 11 is an enlarged view of an area L of FIG. 10.

Figure 11:
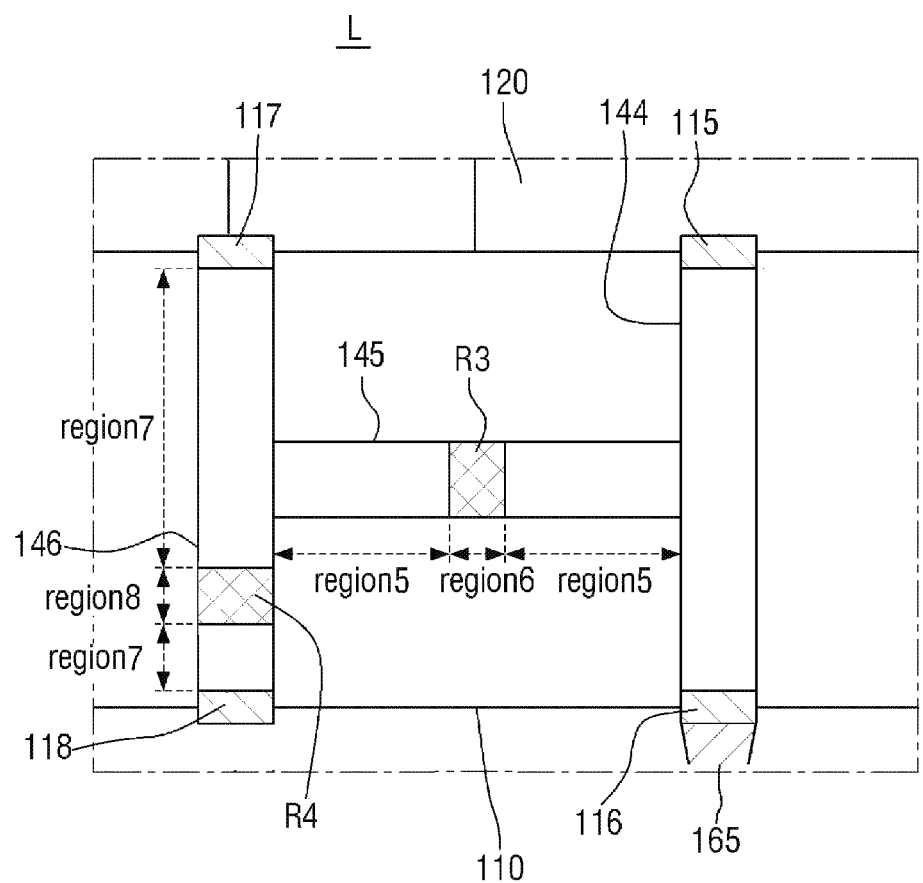
FIG. 11 is an enlarged view of an area L of FIG. 10.

Referring to FIGS. 1, 10, and 11, the interposer 110 may further include a third resistor R3 and a fourth resistor R4.

The first semiconductor chip 120 and the interposer 110 may be electrically connected not only via the first terminal 111, but also via a fifth terminal 115 and a ninth terminal 119. The interposer 110 and the second semiconductor chip 130 may be electrically connected not only via the second terminal 112, but also via a sixth terminal 116 and a tenth terminal 119'.

The interposer 110 may further include a seventh terminal 117 and an eighth terminal 118. The third terminal 113 may be electrically connected to a first tester TESTER1. The seventh terminal 117 may also be electrically connected to a second tester TESTER2. For convenience, the tester to which the third terminal 113 is electrically connected and the tester to which the seventh terminal 117 are distinguished as the first tester TESTER1 and the second tester TESTER2, respectively, but the disclosure is not limited thereto. For example, the first tester TESTER1 and the second tester TESTER2 may be provided as a single test instrument.

The eighth terminal 118, like the fourth terminal 114, may be electrically connected to the reference voltage terminal of the circuit board 100. In some example embodiments, a power supply voltage may be electrically connected to the reference voltage terminal, in which case, no particular power supply voltage for driving the interposer 110 may be needed. In other example embodiments, a ground voltage may be electrically connected to the reference voltage terminal.

The fourth wire 144 may electrically connect the fifth terminal 115 and the sixth terminal 116. In other words, the fourth wire 144 may electrically connect the circuit board 100 and the first semiconductor chip 120.

The fourth wire 144 may be a path of the transmission of a signal between the first semiconductor chip 120 and the circuit board 100. That is, the fourth wire 144 may be a path of the transmission of a signal between the first semiconductor chip 120 and the second semiconductor chip 130.

The fifth wire 145 may be electrically connected to the fourth wire 144 and a sixth wire 146. The fifth wire 145 may include a third resistor R3.

The fifth wire 145 may include a fifth region "region5" and a sixth region "region6" including the third resistor R3. In some example embodiments, the fifth region "region5" may be provided on both sides of the sixth region "region6".

The electrical conductivity of the fifth region "region5" of the fifth wire 145 may differ from the electrical conductivity of the sixth region "region6" of the fifth wire 145. For example, the electrical conductivity of the fifth region region5" may be higher than the electrical conductivity of the sixth region "region6", The sixth wire 146 may electrically connect the seventh terminal 117 and the eighth terminal 118. In some example embodiments, the sixth wire 146 may electrically connect a tester terminal and the reference voltage terminal. That is, the seventh terminal 117 may be a tester terminal, and the eighth terminal 114 may be a terminal for applying the reference voltage.

The sixth wire 146 may allow the second tester TESTER2, which is connected to the seventh terminal 117, to monitor a signal transmitted between the first semiconductor chip 120 and the second semiconductor chip 130 via the fourth wire 144.

In some example embodiments, the fourth wire 144, the sixth wire 146, and the fifth wire 145 may be electrically connected via contacts, in which case, the fourth wire 144, the fifth wire 145, and the sixth wire 146 may not necessarily be disposed on the same plane as one another.

The sixth wire 146 may include the fourth resistor R4, which is different from the third resistor R3. The sixth wire 146 may include a seventh region "region7" and an eighth region "region8" including the fourth resistor R4.

The seventh region "region7" may be provided on, for example, both sides of the eighth region "region8", but the disclosure is not limited thereto. For example, the eighth region "region8" may account for the entire area between a node at which the fifth wire 145 and the sixth wire 146 are electrically connected and the eighth terminal 118.

The electrical conductivity of the seventh region "region7" of the sixth wire 146 may differ from the electrical conductivity of the eighth region "region8" of the sixth wire 146. For example, the electrical conductivity of the seventh region "region7" may be higher than the electrical conductivity of the eighth region "region8".

The electrical conductivity of the sixth region "region6" of the fifth wire 145 may differ from the electrical conductivity of the eighth region "reigon8" of the sixth wire 146. The electrical conductivity of each region may vary depending on, for example, the resistance of resistor components included in the second tester TESTER2, which is electrically connected to the seventh terminal 117.

The resistance of the third resistor R3 may be the same as the sum of the resistance of the resistor components included in the second tester TESTER2, which is electrically connected to the seventh terminal 117, and the resistance of the fourth resistor R4.

In some example embodiments, the fourth resistor R4 may be provided between the seventh terminal 117 and a node at which the fifth wire 145 and the sixth wire 146 are electrically connected to each other. In response to the fourth wire 144, the fifth wire 145, and the sixth wire 146 being electrically connected via contacts, the fourth resistor R4 may be provided between the contact electrically connecting the fifth wire 145 and the sixth wire 146 and the eighth terminal 118.

The interposer 110 may further include a seventh wire 147. The seventh wire 147 may electrically connect the ninth terminal 119 and the tenth terminal 119'. In some example embodiments, no tester may be connected to the seventh wire 147.

In other words, in the semiconductor device and the semiconductor package, a tester may be connected only to each desired wire.

The second semiconductor chip 130 may be isolated from the interposer 110 over the circuit board 100. The second semiconductor chip 130 may be electrically connected to the circuit board 100 via the first terminal 131 of the second semiconductor chip 130, but also via the second terminal 132 and the third terminal 133 of the second semiconductor chip 130.

The second semiconductor chip 130 may be electrically connected to the sixth terminal 116. That is, the second semiconductor chip 130 may be electrically connected to the interposer 110 via the sixth terminal 116.

More specifically, the circuit board 100 may further include a third via 163, a fourth via 164, a fifth via 165, a sixth via 166, a second transmission line 152, and a third transmission line 153. The third via 163 may electrically connect the tenth terminal 110' and the second transmission line 152. The fourth via 164 may electrically connect the second terminal 132 of the second semiconductor chip 130 and the second transmission line 152.

The fifth via 165 may connect the sixth terminal 116 and the third transmission line 153. The sixth via 166 may connect the third terminal 133 of the second semiconductor chip 130 and the third transmission line 153.

Accordingly, the second semiconductor chip 130 may be electrically connected to the tenth terminal 119' via the second transmission line 152. Also, the second semiconductor chip 130 may be electrically connected to the sixth terminal 116 via the third transmission line 153.

The tenth terminal 119' may be electrically connected to the first semiconductor chip 120 via the seventh wire 147. The sixth terminal 116 may be electrically connected to the first semiconductor chip 120 via the fourth wire 144. Accordingly, the second semiconductor chip 130 may be electrically connected to the first semiconductor chip 120.

The semiconductor package may include the interposer 110, which includes a tester terminal. That is, as mentioned above, the tester terminal may be the seventh terminal 117 for monitoring a signal transmitted between the first semiconductor chip 120 and the second semiconductor chip 130. In other words, a tester, i.e., the second tester TESTER2, may be connected to the seventh terminal 117.

The second tester TESTER2, which is connected to the seventh terminal 117, may be a test instrument not included in the semiconductor package. In other words, the seventh terminal 117 may be connected to the outside of the semiconductor package.

The semiconductor device and the semiconductor package according to example embodiments of the inventive concepts will hereinafter be described in further detail with reference to FIGS. 1 and 10 through 12, avoiding any redundant description fur clarity.

Figure 12:
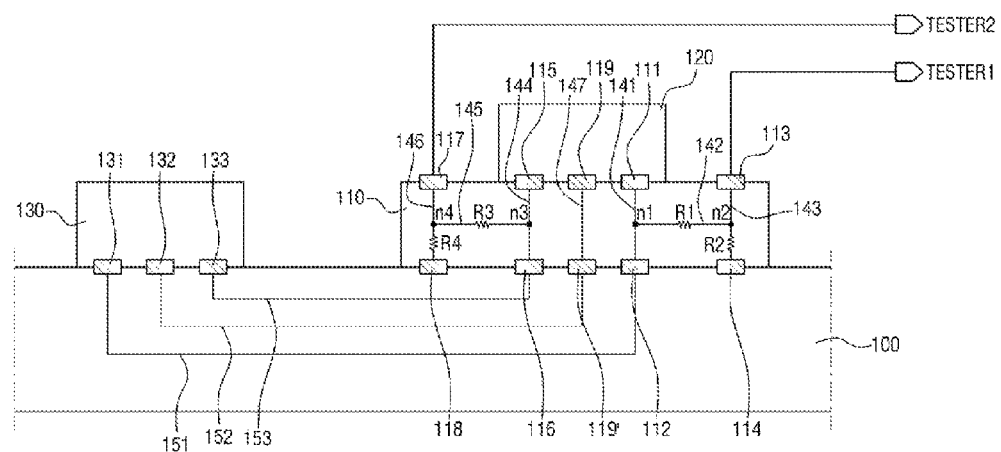
FIG. 12 is a circuit diagram of FIG. 10.

FIG. 12 is a circuit diagram of FIG. 10,

Referring to FIGS. 1 and 10 through 12, the interposer 110 may include the fourth wire 144 acting as a third signal line 144, the sixth wire 146 acting as a fourth signal line 146, the third resistor R3, and the fourth resistor R4.

The third signal line 144 may be the fourth wire 144 of FIG. 10. That is, the third signal line 144 may electrically connect the fifth terminal 115 and the sixth terminal 116. The third signal line 144 may include a third node n3.

The fourth signal line 146 may be the sixth wire 146 of FIG. 10. That is, the fourth signal line 146 may electrically connect the seventh terminal 117 and the eighth terminal 118. The fourth signal line 146 may include a fourth node n4.

The fourth signal line 146 may be connected to the second tester TESTER2.

The third node n3 may be a point at which the fourth wire 144 and the fifth wire 145 are electrically connected to each other. The fourth node n4 may be a point at which the fifth wire 145 and the sixth wire 146 are electrically connected to each other.

The third resistor R3 may be connected between the third node n3 and the fourth node n4. For example, one end of the third resistor R3 may be connected to the third node n3, and the other end of the third resistor R3 may be connected to the fourth node n4.

The fourth resistor R4 may be directly connected to the fourth node n4. The fourth resistor R4 may be connected between the fourth node n4 and the eighth terminal 118. That is, one end of the fourth resistor R4 may be directly connected to the fourth node n4, and the other e d of the fourth resistor R4 may be connected to the eighth terminal 118 to which the reference voltage is applied.

In some example embodiments, one end of the fourth resistor R4 may be directly connected to the fourth node n4, and the other end of the fourth resistor R4 may be connected to a power supply voltage via the eighth terminal 118. Alternatively, one end of the fourth resistor R4 may be directly connected to the fourth node n4, and the other end of the fourth resistor R4 may be connected to a ground voltage via the eighth terminal 118.

The resistance of the third resistor R3 may differ from the resistance of the fourth resistor R4 but the disclosure is not limited thereto. The resistance of the fourth resistor R4 may be adjusted according to the resistance of the resistor components included in the second tester TESTER2, which is electrically connected to the seventh terminal 117.

A path of the transmission of a signal between the first semiconductor chip 120 and the second semiconductor chip 130 may further include the third signal line 144. That is, a signal may be transmitted between the first semiconductor chip 120 and the second semiconductor chip 130 via the third signal line 144.

The third resistor R3, which is connected between the third node n3 and the fourth node n4, and the fourth signal line 146, which is connected between the fourth node n4 and the second tester TESTER2, may form another signal path. That is, the second tester TESTER2 may be connected to the third signal line 144 via the third node n3 and the fourth node n4.

The third resistor R3 may be disposed as near as possible to the third signal line 144. The fourth resistor R4 may be disposed at an arbitrary location between the third resistor R3 and the second tester TESTER2.

The fourth resistor R4 may be connected in parallel to the third resistor R3 relative to the fourth node n4. In other words, when viewed from the second tester TESTER2, the third resistor R3 and the fourth resistor R4 may be connected in parallel to each other.

At least some of the benefits of the semiconductor device and the semiconductor package according to example embodiments of the inventive concepts will hereinafter be described with reference to FIGS. 4 and 13 through 15.

Figure 13:
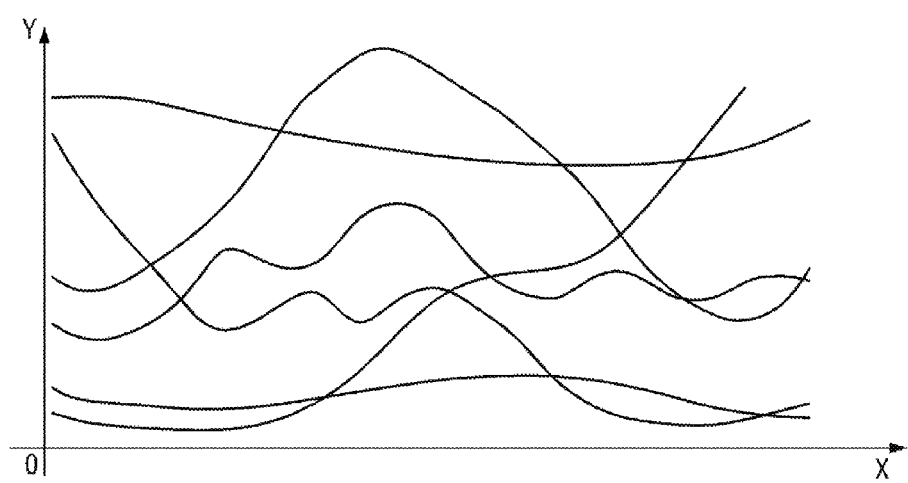
FIGS. 13 through 15 are graphs for explaining the benefits of a semiconductor device and a semiconductor package including the same, according to example embodiments of the inventive concepts.
Figure 14:
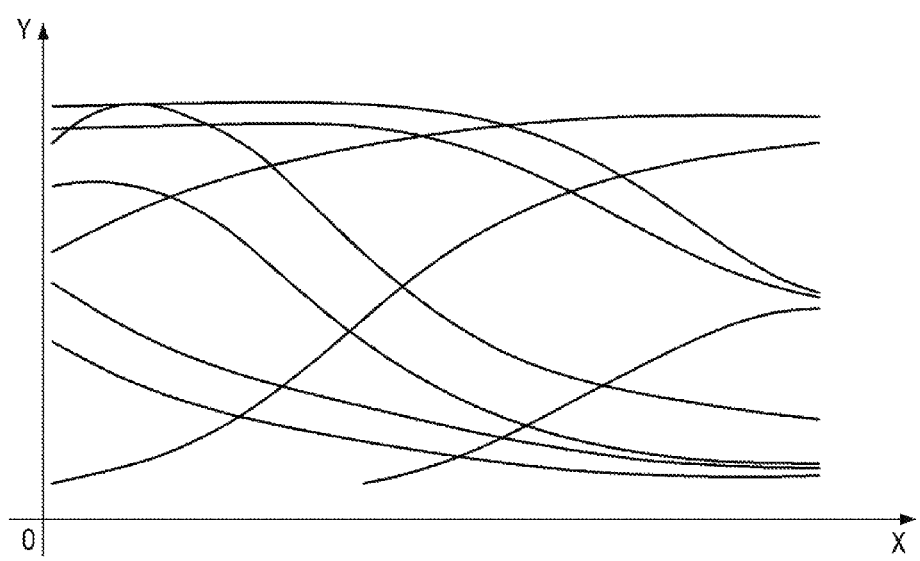
Figure 15:
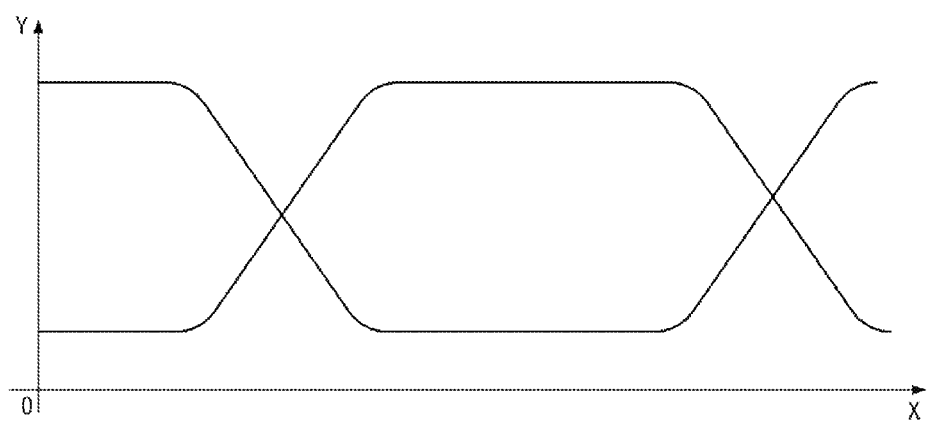

FIGS. 13 through 15 are graphs for explaining at least some of the benefits of the semiconductor device and the semiconductor package according to example embodiments of the inventive concepts. In FIGS. 13 through 15, the X-axis represents, for example, time, and the Y-axis represents, for example, the direct current (DC) offset of an input signal.

More specifically, FIG. 13 is a graph obtained from the first terminal 111 when the first resistor RI and the second resistor R2 are not connected in the circuit configuration illustrated in FIG. 4.

Referring to FIG. 13, when the first resistor RI and the second resistor R2 are not connected, the signal waveform at the first terminal 111 may not show the pattern of an eye diagram. Since no eye diagram is secured from the first terminal 111, signals may not be properly transmitted, especially in a high-speed operating condition.

FIG. 14 is a graph obtained from the third terminal 113 when the first resistor RI is connected, but the second resistor R2 is not connected, in the circuit configuration illustrated in FIG. 4.

Referring to FIG. 14, when the first resistor R1 is connected, but the second resistor R2 is not connected, the signal waveform at the third terminal 113 may not show the pattern of an eye diagram. Since no eye diagram is secured from the third terminal 113, desired signals may not be able to be measured, especially in a high-speed operating condition.

FIG. 15 is a graph obtained from the first terminal 111 and the third terminal 113 of FIG. 4.

For convenience, graphs respectively obtained from the first terminal 111 and the third terminal 113 are incorporated into a single graph of FIG. 15, but the disclosure is not limited thereto. It is obvious that the X- and Y-axis scales may vary depending on DC offset measurements.

Referring to FIG. 15, an eye diagram may be secured from the first terminal 111 and the third terminal 113 of the semiconductor device and the semiconductor package according to example embodiments of the inventive concepts. Accordingly, signals may be smoothly transmitted between the first semiconductor chip 120 and the second semiconductor chip 130, even in a high-speed operating condition. Also, desired signals may be measured at the tester TESTER, which is connected to the third terminal 113.

Since the first resistor R1 is added to a signal path from the interposer 110 to the tester TESTER, signal distortion that may be caused due to a connection to the tester TESTER may be reduced. Also, the first resistor R1 may make the transmission of signals between the first semiconductor chip 120 and the second semiconductor chip 130 smooth.

Since the second resistor R2 is connected in parallel to the first resistor R1, which is added to the signal path from the interposer 110 to the tester TESTER, the effect of termination of the third terminal 113 may be offered. For example, without proper termination, the eye may be constrained or stressed while the second resistor R2 may make the eye more relaxed.

Accordingly, the semiconductor device and the semiconductor package according to example embodiments of the inventive concepts may improve the signal integrity in a high-speed operating condition. Also, the semiconductor device and the semiconductor package according to example embodiments of the inventive concepts may reduce the influence of signal distortion on the measurement of signals at the first terminal 111 and/or the third terminal 113.

The semiconductor device and the semiconductor package according to example embodiments of the inventive concepts may be applicable to, for example, an inter-chip connection signal measurement apparatus or a memory test apparatus.

Figure 16:
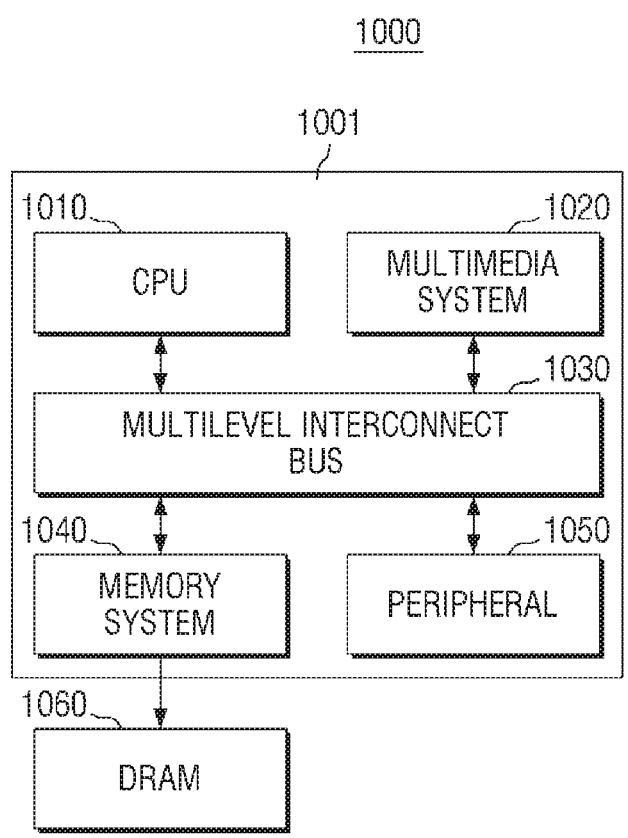
FIG. 16 is a block diagram of a system-on-chip (SoC) system including a semiconductor device fabricated by a manufacturing method of a semiconductor device according to example embodiments of the inventive concepts.

FIG. 16 is a block diagram of a system-on-chip (SoC) system including a semiconductor device fabricated by a manufacturing method of a semiconductor device according to example embodiments of the inventive concepts.

Referring to FIG. 16, a SoC system 1000 includes an application processor 1001 and a DRAM 1060, The application processor 1001 may include a central processing unit 1010, a multimedia system 1020, a bus 1030, a memory system 1040, and a peripheral circuit 1050.

The central processing unit 1010 may include at least one processor.

The processor may be implemented by at least one semiconductor chip disposed on a printed circuit board. The processor may be an arithmetic logic unit, a digital signal processor, a microcomputer, a field programmable array, a programmable logic unit, a microprocessor or any other device capable of responding to and executing instructions in a defined manner.

The processor may be programmed with instructions that configure the processor into a special purpose computer to perform operations necessary for driving the SoC system 1000. In some example embodiments, the central processing unit 1010 may be provided as a multicore environment including a plurality of cores.

The multimedia system 1020 may be used to perform various multimedia functions in the SoC system 1000. The multimedia system 1020 may include a three-dimensional (3D) engine module, a video codec, a display system, a camera system, and a post-processor.

The bus 1030 may be used by the central processing unit 1010, the multimedia system 1020, the memory system 1040, and the peripheral circuit 1050 to communicate data with one another. In some example embodiments, the bus 1030 may have a multilayer structure. More specifically, a multilayer Advanced High-performance Bus (AHB) or a multilayer Advanced eXtensible Interface (AXI) may be used as the bus 1030, but example embodiments of the inventive concepts are not limited thereto.

The memory system 1040 may include a non-volatile memory, a volatile memory, a hard disk, an optical disk, and a combination of two or more of the above-mentioned devices. The memory may be a non-transitory computer readable medium. The non-transitory computer-readable media may also be a distributed network, so that the program instructions are stored and executed in a distributed fashion. The non-volatile memory may be a Read Only Memory (ROM), a Programmable Read Only Memory (PROM), an Erasable Programmable Read Only Memory (EPROM), or a flash memory. The volatile memory may be a Random Access Memory (RAM).

The memory system 1040 may provide an environment necessary for connecting the application processor 1010 to an external memory (for example, the DRAM 1060) and allowing the application processor 1010 to operate at high speed. In some example embodiments, the memory system 1040 may include an additional controller (for example, a DRAM controller) for controlling the external memory (for example, the DRAM 1060).

The peripheral circuit 1050 may provide an environment necessary for allowing the SoC system 1000 to properly access an external device (for example, a main board). Accordingly, the peripheral circuit 1050 may be equipped with various interfaces that allow the external device to be compatible with the SoC system 1000.

The DRAM 1060 may serve as an operating memory necessary for the operation of the application processor 1001. In some example embodiments, the DRAM 1060 may be disposed outside the application processor 1001. More specifically, the DRAM 1060 and the application processor 1001 may be packaged together in the form of a POP.

At least one of the elements of the SoC system may include the semiconductor device according to example embodiments of the inventive concepts.

While the inventive concepts have been particularly shown and described with reference to some example embodiments thereof, it will be understood by those of ordinary skill in the art that various changes in form and details may be made therein without departing from the spirit and scope of the example embodiments of the inventive concepts as defined by the following claims. It is therefore desired that the example embodiments be considered in all respects as illustrative and not restrictive, reference being made to the appended claims rather than the foregoing description to indicate the scope of the example embodiments.

What is claimed is:

1. A semiconductor device, comprising:
a first terminal electrically connected to a first semiconductor chip;
a second terminal electrically connected to a second semiconductor chip;
a first signal line configured to electrically connect the first terminal and the second terminal;
a third terminal configured to electrically connect to a tester, the tester configured to monitor a signal transmitted between the first semiconductor chip and the second semiconductor chip;
a second signal line configured to electrically connect the third terminal and a fourth terminal, the fourth terminal configured to receive a reference voltage;
a first resistor electrically connected between a first node and a second node, the first node being associated with the first signal line and the second node being associated with the second signal line; such that a first end of the first resistor is connected to the first node between the first semiconductor chip and the second semiconductor chip and a second end of the first resistor is connected to the tester via the second node; and
a second resistor electrically connected between the second node and the fourth terminal such that a first end of the second resistor is directly connected to the second node and a second end of the second resistor is connected to the fourth terminal.

2. The semiconductor device of claim 1, further comprising:
an interposer configured to electrically connect the tester to the semiconductor device.

3. The semiconductor device of claim 1, wherein the reference voltage is a power supply voltage.

4. The semiconductor device of claim 1, wherein a sum of a resistance of resistor components of the tester and a resistance of the second resistor equals a resistance of the first resistor.

5. The semiconductor device of claim 1, wherein the second resistor and the first resistor are connected in parallel to the second node.

6. A semiconductor package, comprising:
a circuit board including a reference voltage terminal configured to receive a reference voltage;
an interposer electrically connected to the circuit board, the interposer including a tester terminal; and
a first semiconductor chip on the interposer, the first semiconductor chip configured to electrically connect to the circuit board and the interposer, wherein the interposer includes,
a first wire configured to electrically connect the circuit board and the first semiconductor chip,
a second wire configured to electrically connect to the first wire, the second wire including a first resistor such that a first end of the first resistor is connected between the first semiconductor chip and the circuit board and a second end of the first resistor is connected to the tester terminal, and
a third wire configured to electrically connect the tester terminal and the reference voltage terminal, the third wire including a second resistor such that a first end of the second resistor is directly connected to the tester terminal and a second end of the second resistor is connected to the reference voltage terminal.

7. The semiconductor package of claim 6, wherein the reference voltage is a power supply voltage.

8. The semiconductor package of claim 6, wherein
the second wire includes a first region and a second region each having a different electrical conductivity, the second region having the first resistor associated therewith, and
the third wire includes a third region and a fourth region each having a different electrical conductivity, the fourth region having the second resistor associated therewith.

9. The semiconductor package of claim 8, wherein the electrical conductivity of the second region differs from the electrical conductivity of the fourth region.

10. The semiconductor package of claim 8, wherein
the electrical conductivity of the first region is higher than the electrical conductivity of the second region, and
the electrical conductivity of the third region is higher than the electrical conductivity of the fourth region.

11. The semiconductor package of claim 6, wherein the second wire is electrically connected to the third wire.

12. The semiconductor package of claim 6, further comprising:
a second semiconductor chip electrically connected to the circuit board and electrically isolated from the interposer, the second semiconductor chip electrically connected to the first wire.

13. The semiconductor package of claim 12, wherein the tester terminal is configured to connect to a tester, the tester being configured to monitor a signal transmitted between the first semiconductor chip and the second semiconductor chip such that the signal is transmitted between the first semiconductor chip and the second semiconductor chip via a first signal path through the first wire that is connected to the second wire, the tester is configured to receive the signal via a second signal path through the second wire including the first resistor, and the second resistor included in the third wire is connected between the second signal path and the reference voltage terminal.

14. The semiconductor package of claim 6, wherein
the first wire electrically connects a first terminal associated with the first semiconductor chip and a second terminal associated with the circuit board,
the first semiconductor chip is electrically connected to the interposer via the first terminal, and
the circuit board is electrically connected to the interposer via the second terminal.

15. The semiconductor package of claim 13, wherein a sum of a resistance of resistor components of the tester and a resistance of the second resistor equals a resistance of the first resistor.

16. A semiconductor device comprising:
an interposer configured to electrically connect a testing device to a first signal path between a first semiconductor chip and a second semiconductor chip, the testing device configured to monitor a signal transmitted via the first signal path between the first semiconductor chip and the second semiconductor chip, the interposer including,
a first resistor configured to electrically connect a first node and a second node, the first node being a node on the first signal path between the first semiconductor chip and the second semiconductor chip and the second node being a node on a second signal path between the first node and the testing device such that a first end of the resistor is connected to the first node between the first semiconductor chip and the second semiconductor chip and a second end of the first resistor is connected to the testing device via the second node, and
a second resistor configured to electrical connect a reference terminal and the second node such that a first end of the second resistor is directly connected to the second node and a second end of the second resistor is connected to the reference terminal, the reference terminal configured to receive a reference voltage.

17. The semiconductor device of claim 16, wherein the first signal path includes a first line configured to electrically connect the first semiconductor chip and the second semiconductor chip and the second signal path includes a second line and a third line, the second line configured to electrically connect the first node and the second node, and the third line configured to electrically connect the testing device to the second node.

18. The semiconductor device of claim 17, wherein the first line is configured to electrically connect the first semiconductor chip and a circuit board having the second semiconductor chip thereon such that the second semiconductor chip is electrically connected to the interposer via the circuit board.

19. The semiconductor device of claim 16, wherein the first resistor has a resistance equal to a sum of a resistance of the testing device and a resistance of the second resistor.

20. The semiconductor device of claim 16, wherein
the first resistor is configured to reduce distortion in the signal transmitted between the first semiconductor chip and the second semiconductor chip via the first signal path, and
the second resistor is configured to compensate for an effect of termination of the testing device when the testing device receives the signal via the second signal path.

* * * * *